(12) United States Patent
Palagashvili et al.

(10) Patent No.: US 8,840,725 B2
(45) Date of Patent: Sep. 23, 2014

(54) CHAMBER WITH UNIFORM FLOW AND PLASMA DISTRIBUTION

(75) Inventors: David Palagashvili, Mountain View, CA (US); Michael D. Willwerth, Campbell, CA (US); Alex Erenstein, San Jose, CA (US); Jingbao Liu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 744 days.

(21) Appl. No.: 12/884,978

(22) Filed: Sep. 17, 2010

(65) Prior Publication Data

US 2011/0162803 A1 Jul. 7, 2011

Related U.S. Application Data

(60) Provisional application No. 61/260,142, filed on Nov. 11, 2009.

(51) Int. Cl.
| | | |
|---|---|---|
| *C23C 16/455* | (2006.01) | |
| *C23C 16/50* | (2006.01) | |
| *C23C 16/509* | (2006.01) | |
| *C23F 1/00* | (2006.01) | |
| *H01L 21/306* | (2006.01) | |
| *H01J 37/32* | (2006.01) | |
| *C23C 16/06* | (2006.01) | |
| *C23C 16/22* | (2006.01) | |

(52) U.S. Cl.
CPC ..... *H01J 37/32449* (2013.01); *H01J 37/32816* (2013.01); *H01J 37/32844* (2013.01); *H01J 37/32091* (2013.01)
USPC ................. 118/715; 118/723 E; 118/723 R; 156/345.29

(58) Field of Classification Search
CPC ................................. H01J 37/32816–37/32844
USPC ............... 118/715, 723 E, 723 R; 156/345.29
See application file for complete search history.

(56) References Cited

U.S. PATENT DOCUMENTS

| | | | | |
|---|---|---|---|---|
| 5,891,350 | A * | 4/1999 | Shan et al. ...................... | 216/71 |
| 6,170,429 | B1 * | 1/2001 | Schoepp et al. .......... | 118/723 R |
| 6,192,827 | B1 * | 2/2001 | Welch et al. ............... | 118/723 E |
| 6,261,408 | B1 * | 7/2001 | Schneider et al. ....... | 156/345.26 |

(Continued)

FOREIGN PATENT DOCUMENTS

| | | | | |
|---|---|---|---|---|
| JP | 09260338 | A * | 10/1997 | ............ H01L 21/304 |
| JP | 2001267304 | A * | 9/2001 | .......... H01L 21/3065 |

OTHER PUBLICATIONS

International Search Report and Written Opinion mailed Jun. 29, 2010 for PCT Application No. PCT/US2010/055617.

*Primary Examiner* — Rudy Zervigon
(74) *Attorney, Agent, or Firm* — Moser Taboada; Alan Taboada

(57) ABSTRACT

Embodiments of the present invention provide a recursive liner system that facilitates providing more uniform flow of gases proximate the surface of a substrate disposed within an apparatus for processing a substrate (e.g., a process chamber). In some embodiments, a recursive liner system may include an outer liner having an outer portion configured to line the walls of a process chamber, a bottom portion extending inward from the outer portion, and a lip extending up from the bottom portion to define a well; and an inner liner having a lower portion configured to be at least partially disposed in the well to define, together with the outer liner, a recursive flow path therebetween.

17 Claims, 1 Drawing Sheet

(56) References Cited

U.S. PATENT DOCUMENTS

| | | | |
|---|---|---|---|
| 6,273,022 B1 * | 8/2001 | Pu et al. ................. 118/723 I |
| 6,402,844 B1 * | 6/2002 | Harada et al. ................ 118/666 |
| 6,568,346 B2 * | 5/2003 | Pu et al. ................. 118/723 I |
| 7,011,039 B1 * | 3/2006 | Mohn et al. ................ 118/723 R |
| 7,048,837 B2 * | 5/2006 | Somekh et al. .......... 204/192.13 |
| 7,416,635 B2 * | 8/2008 | Moriya et al. ........... 156/345.34 |
| 7,422,636 B2 * | 9/2008 | Ishizaka ..................... 118/719 |
| 7,654,010 B2 * | 2/2010 | Moriya et al. ................ 34/449 |
| 7,708,834 B2 * | 5/2010 | Horimizu ..................... 118/715 |
| 7,811,428 B2 * | 10/2010 | Nishimoto et al. ...... 204/298.11 |
| 7,910,218 B2 * | 3/2011 | Lin et al. ..................... 428/469 |
| 7,987,814 B2 * | 8/2011 | Carducci et al. .......... 118/723 R |
| 7,993,457 B1 * | 8/2011 | Krotov et al. ................ 118/719 |
| 8,021,743 B2 * | 9/2011 | Lin et al. ..................... 428/220 |
| 8,043,430 B2 * | 10/2011 | Dhindsa et al. .............. 118/715 |
| 8,092,598 B2 * | 1/2012 | Baek et al. ................... 118/715 |
| 8,118,938 B2 * | 2/2012 | Carducci et al. ............. 118/715 |
| 8,142,567 B2 * | 3/2012 | Kobayashi et al. ........... 118/715 |
| 8,282,736 B2 * | 10/2012 | Carducci et al. ............. 118/715 |
| 8,506,713 B2 * | 8/2013 | Takagi ........................ 118/715 |
| 8,608,851 B2 * | 12/2013 | Ni et al. ....................... 118/715 |
| 2003/0136766 A1 | 7/2003 | Hoffman et al. |
| 2003/0192646 A1 * | 10/2003 | Wu et al. .................. 156/345.49 |
| 2004/0072426 A1 * | 4/2004 | Jung ............................ 438/689 |
| 2004/0082251 A1 * | 4/2004 | Bach et al. ..................... 445/60 |
| 2004/0206309 A1 * | 10/2004 | Bera et al. .................... 118/728 |
| 2005/0224180 A1 | 10/2005 | Bera et al. |
| 2006/0000552 A1 * | 1/2006 | Tanaka et al. ............ 156/345.28 |
| 2006/0105575 A1 | 5/2006 | Bailey, III et al. |
| 2006/0118042 A1 * | 6/2006 | Horimizu ..................... 118/720 |
| 2006/0196604 A1 * | 9/2006 | Moriya et al. ........... 156/345.34 |
| 2006/0213439 A1 * | 9/2006 | Ishizaka ....................... 118/715 |
| 2006/0236932 A1 | 10/2006 | Yokogawa et al. |
| 2007/0116873 A1 * | 5/2007 | Li et al. ...................... 427/248.1 |
| 2007/0256785 A1 | 11/2007 | Pamarthy et al. |
| 2007/0284043 A1 * | 12/2007 | Tanaka et al. ............ 156/345.28 |
| 2009/0028761 A1 * | 1/2009 | Devine et al. ............. 422/186.04 |
| 2009/0188625 A1 * | 7/2009 | Carducci et al. .......... 156/345.34 |
| 2010/0081284 A1 | 4/2010 | Balakrishna et al. |
| 2010/0192354 A1 * | 8/2010 | Horimizu .................... 29/525.12 |

* cited by examiner

CHAMBER WITH UNIFORM FLOW AND PLASMA DISTRIBUTION

CROSS-REFERENCE TO RELATED APPLICATIONS

This application claims benefit of U.S. provisional patent application Ser. No. 61/260,142, filed Nov. 11, 2009, which is herein incorporated by reference.

FIELD

Embodiments of the present invention generally relate to semiconductor processing and, more particularly, to apparatus for processing substrates.

BACKGROUND

As the critical dimensions for semiconductor devices continue to shrink, there is an increased need for semiconductor process equipment that can uniformly process semiconductor substrates. One instance of where this need may arise is in controlling the flow of process gases proximate the surface of a substrate disposed in a process chamber.

Thus, the inventors have provided an improved apparatus for processing substrates.

SUMMARY

Embodiments of the present invention provide a recursive liner system that facilitates providing more uniform flow of gases proximate the surface of a substrate disposed within an apparatus for processing a substrate (e.g., a process chamber). In some embodiments, a recursive liner system may include an outer liner having an outer portion configured to line the walls of a process chamber, a bottom portion extending inward from the outer portion, and a lip extending up from the bottom portion to define a well; and an inner liner having a lower portion configured to be at least partially disposed in the well to define, together with the outer liner, a recursive flow path therebetween.

In some embodiments, an apparatus for processing substrates may include a process chamber having a processing volume and an exhaust volume; a substrate support disposed in the process chamber and configured to support a substrate in a lower portion of the processing volume; and a recursive liner system disposed in the process chamber, the recursive liner system may include an outer liner having an outer portion configured to line outer walls of the process chamber, a bottom portion extending inward from the outer portion, and a lip extending up from the bottom portion to define a well; and an inner liner coupled to the substrate support and having a lower portion configured to be at least partially disposed in the well to define, together with the outer liner, a recursive flow path therebetween.

In some embodiments, an apparatus for processing substrates may include a process chamber having a processing volume and an exhaust volume; a substrate support disposed in the process chamber to support a substrate in a lower portion of the processing volume; and a recursive liner system disposed in the process chamber. The recursive liner system may include an outer liner that provides provide a uniform RF ground path, the outer liner having an outer portion to line outer walls of the process chamber, a bottom portion extending inward from the outer portion, and a lip extending up from the bottom portion to define a well; an inner liner coupled to the substrate support and having a lower portion at least partially disposed in the well and spaced apart from surfaces of the outer liner; and a recursive flow path disposed within the well between the outer liner and the inner liner.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
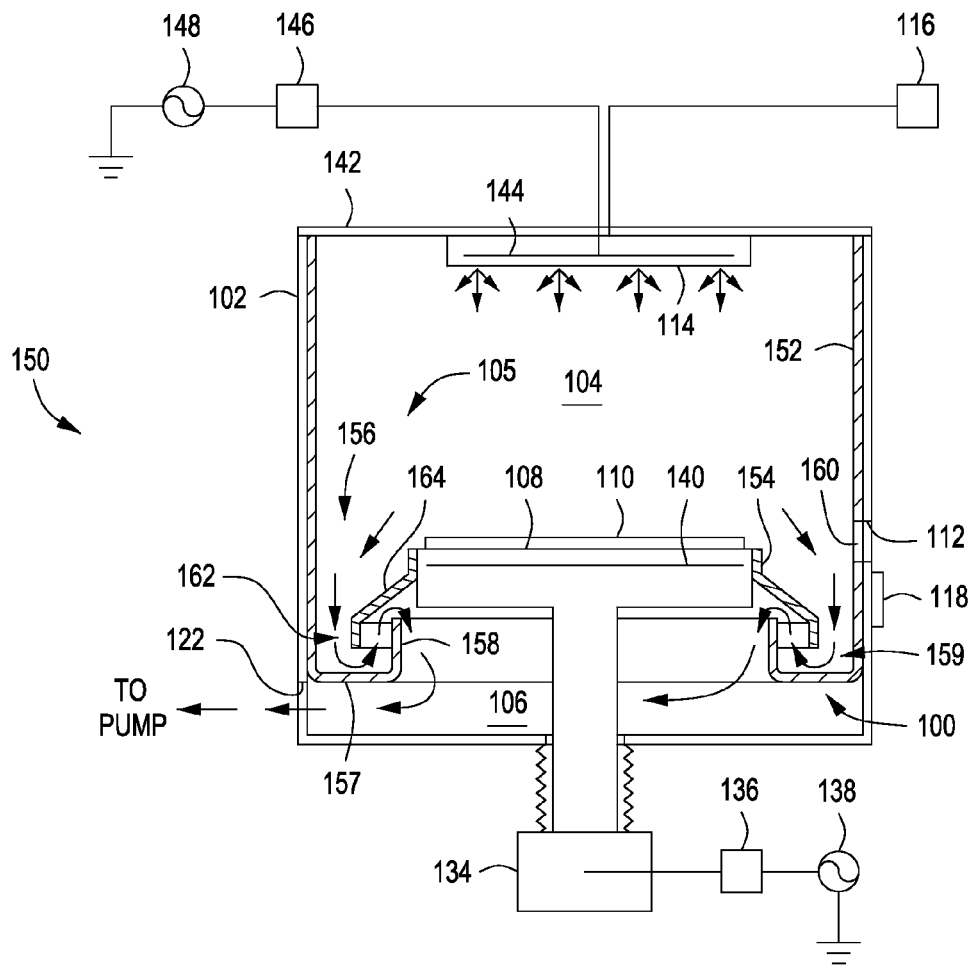
FIG. 1 depicts an apparatus for processing substrates having an inventive liner system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The inventors have observed that, in conventional process chambers that utilize a single pump to exhaust process gases from a side of the process chamber, process non-uniformities (for example, non-uniform etch rates in an etch chamber) exist that are believed to be due to non-uniform flow of process gases and/or a non-uniform RF ground path in the process chamber that each may cause plasma non-uniformities. Embodiments of the present invention provide an improved liner system that may facilitate providing a more uniform flow of gases proximate the surface of a substrate disposed within an apparatus for processing a substrate (e.g., a process chamber). In some embodiments, the process chamber may have an asymmetric, or offset exhaust system for removing process gases from the process chamber that would otherwise provide asymmetric flow patterns within the process chamber. The more uniform flow of gases proximate the surface of the substrate may facilitate more uniform processing of the substrate. The improved liner system further provides a symmetric RF ground path within the chamber. Such uniform RF ground path may also facilitate more uniform processing of the substrate.

FIG. 1 depicts a schematic view of an apparatus 150 for processing substrate using a recursive liner system 100 in accordance with some embodiments of the present invention. The recursive liner system 100 may be utilized in a process chamber 102 having a symmetric or, as shown, an asymmetric, or offset exhaust system for removing excess process gases, processing by-products, or the like, from the interior of the process chamber 102 (offset pump port 122 depicted in FIG. 1). Exemplary process chambers that may be modified to advantage using the invention disclosed herein may include the DPS®, ENABLER®, ADVANTEDGE™, PRO- DUCER®, or other process chambers, available from Applied Materials, Inc. of Santa Clara, Calif. Other suitable chambers include any chambers that may require substantially uniform pressure, flow, and/or residence time of process gases flowing therethrough, or uniform plasma processing, including chambers having symmetrically arranged pumping ports.

The process chamber 102 has an inner volume 105 that may include a processing volume 104 and an exhaust volume 106. The processing volume 104 may be defined, for example, between a substrate support 108 disposed within the process chamber 102 for supporting a substrate 110 thereupon during processing and one or more gas inlets, such as a showerhead 114 and/or nozzles provided at desired locations. In some embodiments, the substrate support 108 may include a mechanism that retains or supports the substrate 110 on the surface of the substrate support 108, such as an electrostatic chuck, a vacuum chuck, a substrate retaining clamp, or the like (not shown). In some embodiments, the substrate support 108 may include mechanisms for controlling the substrate temperature (such as heating and/or cooling devices, not shown) and/or for controlling the species flux and/or ion energy proximate the substrate surface.

In some embodiments, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing RF power at a desired frequency (e.g., about 2 MHz, or about 13.56 MHz, or about 60 MHz). The one or more bias power sources may provide either continuous or pulsed power. Alternatively, in some embodiments, the bias power source may be a DC or pulsed DC source.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be vertically stationary or movable and may or may not be configured to rotate. For example, in some embodiments, the substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

The one or more gas inlets (e.g., the showerhead 114) may be coupled to a gas supply 116 for providing one or more process gases into the processing volume 104 of the process chamber 102. Although a showerhead 114 is shown in FIG. 1, additional or alternative gas inlets may be provided such as nozzles or inlets disposed in the ceiling or on the sidewalls of the process chamber 102 or at other locations suitable for providing gases as desired to the process chamber 102.

In some embodiments, RF power may be capacitively coupled to an upper electrode proximate an upper portion of the process chamber 102. For example, the upper electrode may be a conductor formed, at least in part, by one or more of a ceiling 142, a showerhead 114, an electrode 144 disposed in the showerhead, or the like, fabricated from a suitable conductive material. One or more RF power sources (one RF power source 148 shown) may be coupled through one or more respective matching networks (matching network 146 shown) to the upper electrode. The one or more plasma sources may be capable of producing RF power at a desired frequency (e.g., about 13.56 MHz, about 60 MHz, about 162 MHz, or the like).

In some embodiments, inductively coupled RF power may be provided for processing. For example, the process chamber 102 may have a ceiling 142 made from a dielectric material and a dielectric showerhead 114. An antenna comprising at least one inductive coil element may be disposed above the ceiling 142. The inductive coil elements may be coupled to one or more RF power sources (such as the RF power source 148) through one or more respective matching networks (matching network 146 shown).

The exhaust volume 106 may be defined, for example, between the substrate support 108 and a bottom of the process chamber 102. The exhaust volume 106 is drawn through the pump port 122 to an exhaust system. For example, a vacuum pump (not shown) may be provided to pump out the exhaust gases from the process chamber 102 and route the exhaust as required to appropriate exhaust handling equipment. A valve (such as a gate valve, or the like) may be provided in the exhaust system to facilitate control of the flow rate of the exhaust gases in combination with the operation of the vacuum pump.

The recursive liner system 100 generally includes an outer liner 152 and an inner liner 154 that interface to form a recursive flow path therebetween. The inner and outer liners 152, 154 may be made of any suitable materials compatible with the processes being performed in the process chamber and may be made out of the same material or different materials. In some embodiments, the inner and outer liners 152, 154 are made out of the same materials. Suitable materials for fabricating the inner and outer liners may include conductive materials or dielectric materials. Examples of suitable conductive materials include, but are not limited to aluminum, stainless steel (SST), or the like. In applications where the walls of the process chamber are grounded, the inner and outer liners may be fabricated from conductive materials. Examples of suitable dielectric materials include, but are not limited to anodized aluminum, yttrium oxide ($Y_2O_3$), or the like.

Figure 3:
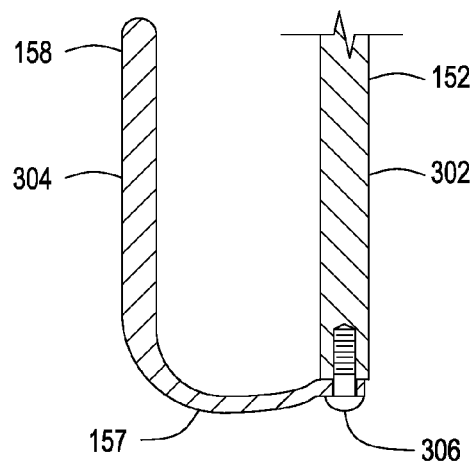
FIG. 3 is a partial cross-sectional side-view of a portion of the recursive liner system in accordance with some embodiments of the present invention.

The outer liner 152 generally lines the sidewalls of the chamber 102 and further includes an inwardly extending bottom 157 and an inner lip 158 that extends upwards from the bottom 157 of the outer liner 152 to define a well 159. The inner lip 158 is generally positioned so as not to interfere with the movement of the substrate support 108 (when movable), and further positioned so as to provide an opening between the inner lip 158 and any adjacent components (such as the substrate support 108 or the inner liner 154) to allow flow of exhaust therethrough. In some embodiments, the outer liner 152 may be of unitary construction. In some embodiments, the outer liner 152 may be of multi-piece construction. For example, in some embodiments, and as depicted in FIG. 3, the inner lip 158 of the outer liner 152 may be fabricated separately (for example outer portion 302 and inner portion 304) and may be coupled together in any suitable manner. For example, the outer and inner portions 302, 304 may be adhered together (for example, by brazing, welding, gluing, epoxying, or the like) or mechanically fastened together (for example, by clamping, bolting, screwing, or the like). In the embodiment depicted in FIG. 3, the outer and inner portions 302, 304 are coupled together via a plurality of bolts 306.

Returning to FIG. 1, the outer liner 152 may further comprise openings that correspond to openings in the process chamber. For example, an opening 160 may be provided to correspond with the slit valve opening 112. In embodiments where gas inlets are provided in the sidewalls of the chamber, openings may be provided to facilitate gas flow into processing volume 104 of the chamber 102. In some embodiments, the outer liner 152 may further extend to line the ceiling 142 of the chamber 102. Alternatively, a separate liner may be provided. In some embodiments, no liner is provided to line the ceiling 142.

The inner liner 154 may be coupled to the substrate support 108 and may circumscribe the substrate support 108 to prevent any gas flow between the liner and the substrate support. A lower portion 162 of the inner liner 154 extends into the well 159 formed by the outer liner 152 to at least partially define, together with the outer liner, the recursive flow path 156. The lower portion 162 of the inner liner 154 may be spaced apart from (e.g., not in contact with) the outer liner 152 such that the recursive flow path 156 extends through the well between the outer and inner liners.

Figure 2:
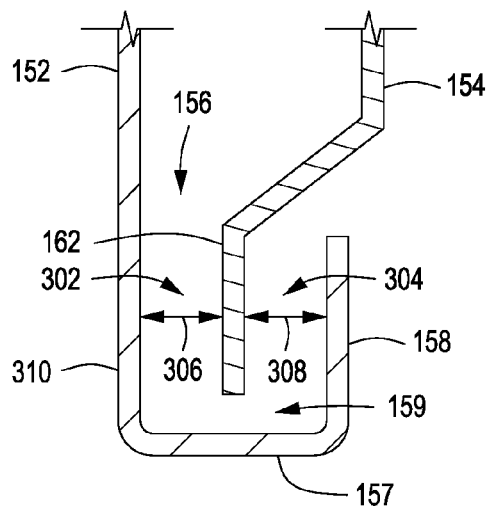
FIG. 2 is a partial cross-sectional side-view of the recursive liner system in accordance with some embodiments of the present invention.

In some embodiments, the lower portion 162 of the inner liner 154 is substantially centered in the well 159 (e.g., the distance between adjacent vertical surfaces of the lower portion 162 and the inner liner 154 may be substantially equal). However, it is not required that the lower portion 162 of the inner liner 154 be centered in the well 159. In fact, the configuration of the inner liner 154 and outer liner 152 provides a self-compensating flow path. For example, as shown in detail in FIG. 2, the recursive flow path 156 is partially defined by respective outer and inner cross-sectional flow areas 302, 304 disposed between the outer and inner liners 152, 154. The outer cross-sectional flow area 302 is defined in part by a distance 306 between the lower portion 162 of the inner liner 154 and an outer portion 310 of the outer liner 152. The inner cross-sectional flow area 302 is defined in part by a distance 308 between the lower portion 162 of the inner liner 154 and the lip 158 of the outer liner 152. If the outer and inner liners 152, 154 are offset with respect to one another (for example, due to manufacturing and/or installation tolerances and/or errors), a net change in the size of the outer and inner cross-sectional flow areas 302, 304 will be zero due to any increases on one side of the recursive liner system 100 being offset by an equivalent decrease on the opposite side of the recursive liner system 100.

Returning to FIG. 1, in some embodiments, the inner liner 154 may include a flared portion, or skirt 164, to provide clearance for the lower portion 162 of the inner liner 154. The dimensions of the skirt 164 may be selected to laterally position the lower portion 162 of the inner liner 154 as desired within the well 159 of the outer liner 152. The skirt 164 may further provide clearance for the substrate support 108 to move vertically within the chamber 102 without contacting the lip 158 of the outer liner 152.

The recursive flow path 156 may advantageously provide more uniform conductance along the flow path between the processing volume 104 and the exhaust volume 106 of the process chamber 102. As such, the pressure and flow rate within the processing volume and across the surface of a substrate that may be supported on the substrate support 108 may be more uniform, as compared to conventional process chambers. Such uniform flow may provide a more uniform plasma within the process chamber 102 as compared to conventional chambers because the symmetric flow pattern within the chamber 102 provided by the recursive liner system 100 will not push or pull the plasma in an asymmetric fashion.

In addition, in embodiments where a plasma is formed in the process chamber 102, the outer liner 154 may provide a more radially uniform RF ground path as compared to liners with asymmetric openings to correspond with an asymmetric pump port. Such symmetric RF ground provided by the outer liner 154 further prevents plasma non-uniformities that could be caused by to electric field non-uniformities in the plasma.

Thus, the recursive liner system 100 facilitates uniform flow of the exhaust gases from the processing volume 104 of the process chamber 102. For example, the recursive liner system 100 may provide at least one of reduced variance of flow resistance azimuthally (or symmetrically) about the substrate support 108 (e.g., substantially equal flow resistance), or substantially equal residence time for the exhaust flow through the recursive liner system 100. In some embodiments, the recursive flow path 156 of the recursive liner system 100 may have a high conductance, or a high conductance as compared to the pump speed. The conductance may be controlled by the combination of the conductivity of the medium through which the exhaust gases may be exhausted (e.g., such as atmospheric or vacuum conditions), the flow length of the conduit (e.g., a distance of the mean flow path between through the recursive flow path about the substrate support 108), and the cross-sectional area of the recursive flow path 156 along the flow length.

While the foregoing is directed to embodiments of the present invention, other and further embodiments of the invention may be devised without departing from the basic scope thereof.

The invention claimed is:

1. A recursive liner system, comprising:
    an outer liner having an outer portion configured to line the walls of a process chamber, a bottom portion extending inward from the outer portion, and a lip extending up from the bottom portion to define a well; and
    an inner liner dimensioned to diffuse a flow of gas and having a lower portion configured to be at least partially disposed in the well to define, together with the outer liner, a recursive flow path therebetween, wherein the lower portion is substantially centered laterally in the well.

2. The system of claim 1, wherein the inner liner further comprises a skirt disposed between the lower portion of the inner liner and an upper portion of the inner liner configured to be coupled to a substrate support.

3. The system of claim 1, wherein the inner liner and outer liners each comprise at least one of aluminum, stainless steel, anodized aluminum, or yttrium oxide.

4. The system of claim 1, wherein the outer liner provides a uniform RF ground path.

5. The system of claim 1, wherein the inner liner and outer liners each comprise at least one of aluminum or stainless steel.

6. The system of claim 1, wherein the outer liner is of unitary construction.

7. The system of claim 1, wherein the outer portion of the outer liner is separate from the bottom portion and wherein the bottom portion is coupled to the outer portion.

8. An apparatus for processing substrates, comprising:
    a process chamber having a processing volume and an exhaust volume;
    a substrate support disposed in the process chamber and configured to support a substrate in a lower portion of the processing volume; and
    a recursive liner system disposed in the process chamber, the recursive liner system, comprising:
        an outer liner having an outer portion configured to line outer walls of the process chamber, a bottom portion extending inward from the outer portion, and a lip extending up from the bottom portion to define a well; and an inner liner coupled to the substrate support, dimensioned to diffuse a flow of gas, and having a lower portion configured to be at least partially disposed in the well to define, together with the outer liner, a recursive flow path therebetween, wherein the lower portion is substantially centered laterally in the well.

9. The apparatus of claim 8, wherein the inner liner further comprises a skirt disposed between the lower portion of the inner liner and an upper portion of the inner liner coupled to the substrate support.

10. The apparatus of claim 8, wherein the inner liner and outer liners each comprise at least one of aluminum, stainless steel, anodized aluminum, or yttrium oxide.

11. The apparatus of claim 8, wherein the outer liner provides a uniform RF ground path.

12. The apparatus of claim 11, wherein the inner liner and outer liners each comprise at least one of aluminum or stainless steel.

13. The apparatus of claim 8, wherein the outer liner is of unitary construction.

14. The apparatus of claim 8, wherein the outer portion of the outer liner is separate from the bottom portion and wherein the bottom portion is coupled to the outer portion.

15. The apparatus of claim 8, wherein the substrate support is vertically movable within the chamber.

16. An apparatus for processing substrates, comprising:
a process chamber having a processing volume and an exhaust volume;
a substrate support disposed in the process chamber to support a substrate in a lower portion of the processing volume; and
a recursive liner system disposed in the process chamber, the recursive liner system, comprising:
an outer liner that provides a uniform RF ground path, the outer liner having an outer portion to line outer walls of the process chamber, a bottom portion extending inward from the outer portion, and a lip extending up from the bottom portion to define a well;
an inner liner coupled to the substrate support, dimensioned to diffuse a flow of gas, and having a lower portion at least partially disposed in the well and spaced apart from surfaces of the outer liner; and
a recursive flow path disposed within the well between the outer liner and the inner liner, wherein the lower portion is substantially centered laterally in the well.

17. The apparatus of claim 16, wherein the substrate support is vertically movable within the chamber.

* * * * *